United States Patent

Okada

[15] 3,678,185

[45] July 18, 1972

[54] SEMICONDUCTOR CIRCUIT FOR PHASE COMPARISON

[72] Inventor: Takashi Okada, Kanagawa, Japan

[73] Assignee: Sony Corporation, Tokyo, Japan

[22] Filed: March 12, 1971

[21] Appl. No.: 123,540

[30] Foreign Application Priority Data

Oct. 13, 1970 Japan....................................45/89877

[52] U.S. Cl.......................178/5.4 SD, 178/69.5 TV, 329/50, 329/101

[51] Int. Cl...........................................................H04n 9/50

[58] Field of Search....................178/5.4 SD, 7.5 S, 69.5 TV; 325/349, 487, 320; 328/133; 329/50, 101, 103

[56] References Cited

UNITED STATES PATENTS 3,591,707 7/1971 Abbott..............................178/5.4 SD

*Primary Examiner*—Richard Murray
*Attorney*—Lewis H. Eslinger, Alvin Sinderbrand and Curtis, Morris & Safford

[57] ABSTRACT

A semiconductor circuit for phase comparison which is devoid of capacitors and hence is suitable for use in an integrated circuit network, comprises a pair of transistors of the same conductivity type connected in the form of a differential amplifier and first and second bridging circuits including groups of series connected diodes and extending between one electrode of one of the transistors and the same electrode of the other transistor. The two input signals which are to be phase compared with each other are respectively supplied to one of the transistors and to the first bridging circuit, and a compared output signal is picked up from the second bridging circuit.

11 Claims, 7 Drawing Figures

INVENTOR.
TAKASHI OKADA
BY
Lewis H. Eslinger

INVENTOR.
TAKASHI OKADA
BY
Lewis H. Eslinger

INVENTOR.
TAKASHI OKADA
BY
Lewis H. Eslinger

SEMICONDUCTOR CIRCUIT FOR PHASE COMPARISON

This invention relates generally to phase comparing circuits, and more particularly to a transistorized phase comparing circuit suitable for use in an integrated circuit network.

Circuits for comparing the phase of one signal with that of another signal are widely used in the electric field. For example, television receivers employ a phase comparing circuit in an automatic frequency control system for a horizontal oscillator or a phase detecting circuit for demodulating a color signal. Conventional phase comparing circuits require a capacitor of relatively great capacitance for clamping one of the two signals to be compared in phase so as to provide a reference signal. Phase comparing circuits, when employed in the automatic frequency control system of a horizontal oscillator of a television receiver, generally compare the phase of a horizontal synchronous pulse with that of a sawtooth wave signal which is produced by integrating a flyback pulse derived from the horizontal oscillator by means of an integrating circuit or the like, and supply the compared output to the horizontal oscillator thereby to hold the frequency and phase of its output at predetermined values. In this case, however, capacitors of relatively great capacitance are required for clamping the horizontal synchronous pulse serving as the reference signal, and this requirement renders difficult any integration of such a phase comparing circuit. More specifically, if such a phase comparing circuit is to be made in the form of an integrated circuit which is integrated with another signal system, for example, a horizontal synchronizing signal separating circuit, the necessity of providing the phase comparing circuit with capacitors, which cannot be incorporated in the integrated circuit, would of course constitute a problem. Therefore, in practice, the capacitors are connected to the phase comparing circuit by means of leads. This results in an increase in the number of terminals of the integrated circuit required for external connections and lessens the advantageous effect of making the phase comparing circuit in the form of an integrated circuit.

Accordingly, an object of this invention is to provide a phase comparing circuit which is suitable to be made in the form of an integrated circuit.

Another object is to provide an improved phase comparing circuit in which capacitor elements are eliminated.

The above, and other objects, features and advantages of this invention, will become apparent from the following detailed description of illustrative embodiments which is to be read in conjunction with the accompanying drawings, wherein.

For a better understanding of the present invention, a brief description will be given first of the prior phase comparing circuits shown in FIGS. 1 and 2.

Figure 1:
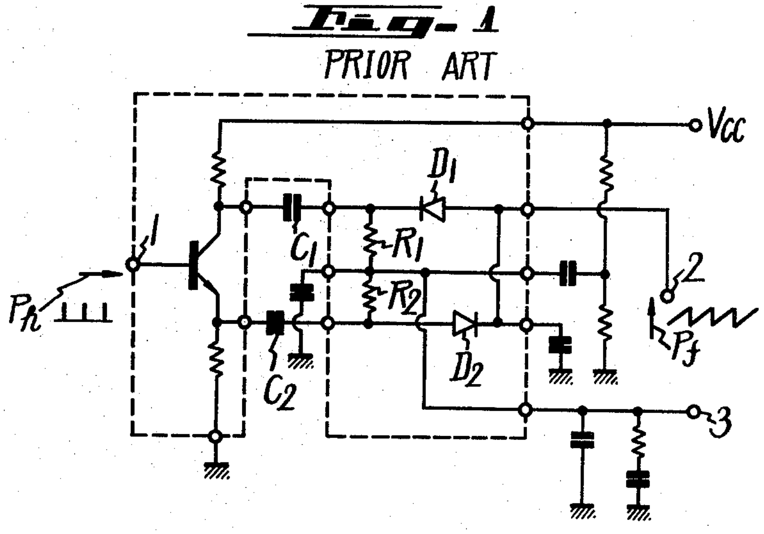
Fig. 1 PRIOR ART
FIGS. 1 and 2 are wiring diagrams showing conventional phase comparing circuits.

In FIG. 1, there is illustrated a conventional phase comparing circuit applied to the automatic frequency control system of a horizontal oscillator in television receivers. In the illustrated circuit, a first input terminal 1 is supplied with a horizontal synchronous pulse Ph, and a second input terminal 2 is supplied with a sawtooth wave voltage signal Pf which is produced by shaping a flyback pulse into the sawtooth waveform by means of an integration circuit (not shown). The horizontal synchronous pulse Ph and the sawtooth wave voltage signal Pf are compared in phase by a circuit made up of capacitors $C_1$ and $C_2$, diodes $D_1$ and $D_2$ and resistors $R_1$ and $R_2$ and the compared output obtained at an output terminal 3 is supplied to the horizontal oscillator (not shown). In this case, the capacitors $C_1$ and $C_2$ are absolutely necessary for clamping the horizontal synchronous signal Ph serving as a reference signal. In general, however, it is very difficult to provide capacitors in the form of an integrated circuit, so that, in the case of making the circuit of FIG. 1 in the form of an integrated circuit, only the circuit elements surrounded by a broken line are made in the form of an integrated circuit and the capacitors $C_1$ and $C_2$ are separately connected to such integrated circuit. This inevitably increases the number of external terminals and connections thereto that are required, and hence detracts from the manufacturing economics and other advantages that are otherwise associated with a fully integrated circuit.

Figure 2:
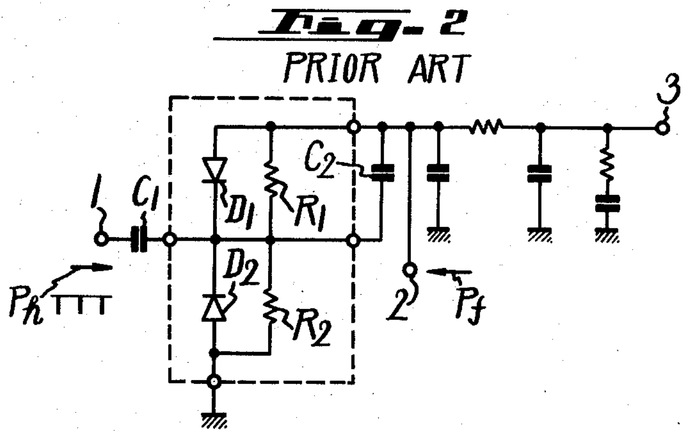
Fig. 2 PRIOR ART

FIG. 2 shows another example of a conventional phase comparing circuit, and in this case also, the capacitors $C_1$ and $C_2$ required for phase comparison prevent the full integration of the circuit.

Figures 3, 5:
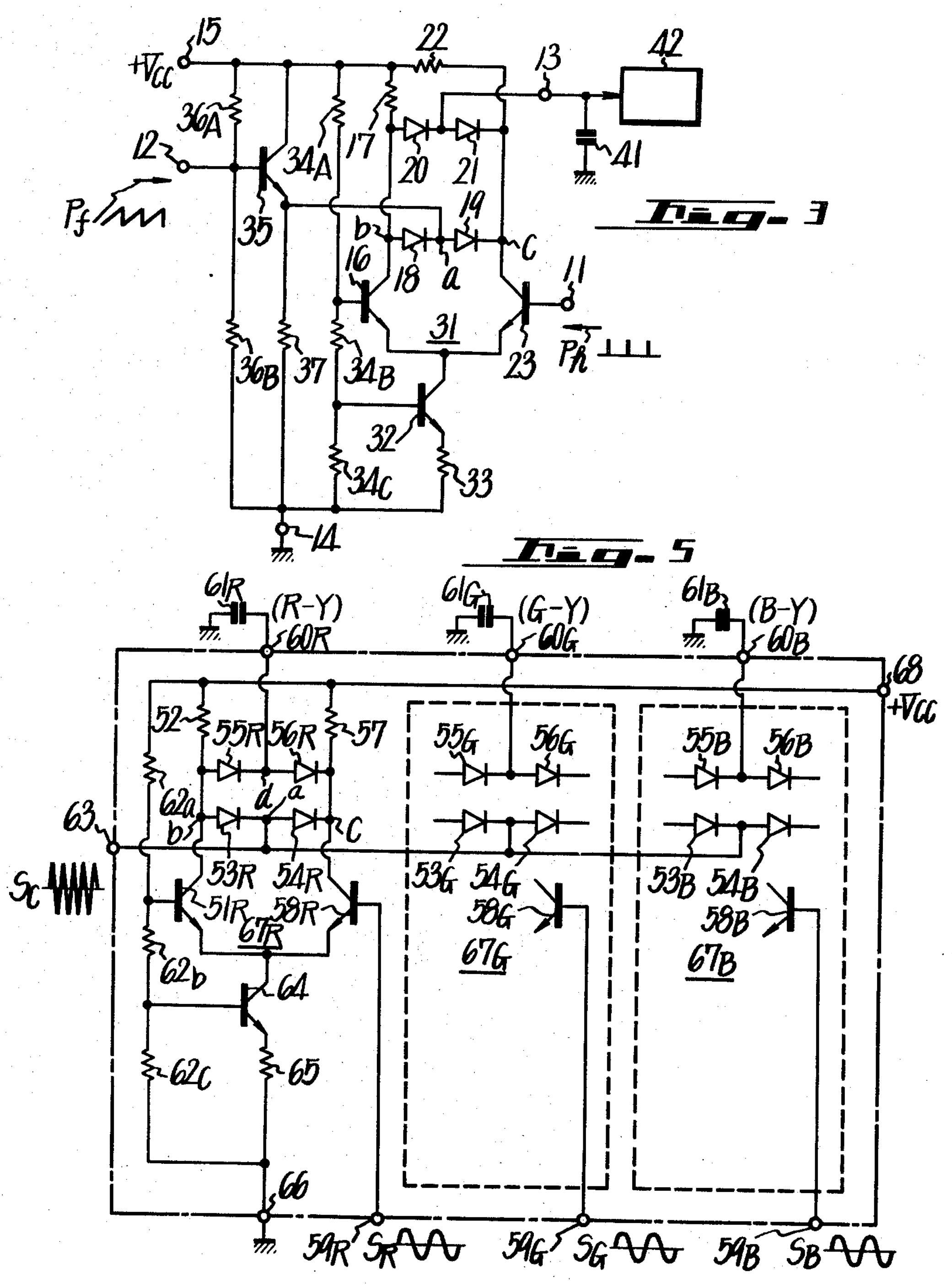
FIG. 3 is a wiring diagram illustrating one example of a phase comparing circuit according to this invention which is shown employed in an automatic frequency control system.
FIG. 5 is a wiring diagram showing another example of a phase comparing circuit according to this invention which is shown applied to a color demodulator circuit.

Referring now to FIG. 3, it will be seen that the phase comparing circuit according to this invention is there shown applied to automatic frequency control of a horizontal oscillator in television receivers. In the illustrated circuit, a pair of transistors 16 and 23 form a differential amplifier 31 and a transistor 32, serving as a constant-current power source, is connected in series to the emitters of transistors 16 and 23. More specifically, the emitters of transistors 16 and 23 are interconnected and connected to a ground terminal 14 through the collector and emitter of the transistor 32, acting as a constant-current power source, and a resistor 33. Further, a series circuit consisting of resistors 34A, 34B and 34C is connected between a power source terminal 15 and the ground terminal 14. The connection point between the resistors 34A and 34B is connected to the base of transistor 16, and the connection point between the resistors 34B and 34C is connected to the base of transistor 32. The collectors of transistors 16 and 23 are connected to power source terminal 15 through resistors 17 and 22, respectively, which are of the same resistance value.

Further, in accordance with the present invention, two diodes 18 and 19 which are connected in series in the same direction, and two diodes 20 and 21 which are also connected in series in the same direction, are connected between the collectors of transistors 16 and 23. The connection point *a* between diodes 18 and 19 is supplied with one of signals to be compared which, in this case, is a sawtooth wave voltage signal Pf produced by shaping a flyback pulse into the sawtooth wave by means of an integration circuit (not shown), and the base of transistor 23 is supplied with the other of the signals to be compared, which, in this case, is a horizontal synchronous pulse Ph.

More specifically, in the embodiment being described, a buffer transistor 35 has its base connected to the input terminal 12 for the sawtooth wave voltage signal Pf, and also to the power source terminal 15 and the ground terminal 14 through resistors 36A and 36B, respectively. Further, the collector of transistor 35 is connected to power source terminal 15 and its emitter is connected to ground terminal 14 through a resistor 37 and also connected to the connection point *a* between diodes 18 and 19. As a result of the foregoing connections, transistor 35 is of the emitter-follower type, and the connection point *a* acts as in input terminal for the sawtooth wave voltage signal Pf. The resistance values of the resistors 36A and 36B are selected to be equal to each other and the sawtooth wave voltage signal Pf is applied to the input terminal 12 to provide, at the connection point *a* a sawtooth voltage signal Pf, as shown in FIG. 4A, which is, for example, positive and has a DC level that is substantially one-half of the voltage Vcc at power source terminal 15.

Figures 4A, 4B, 4C:
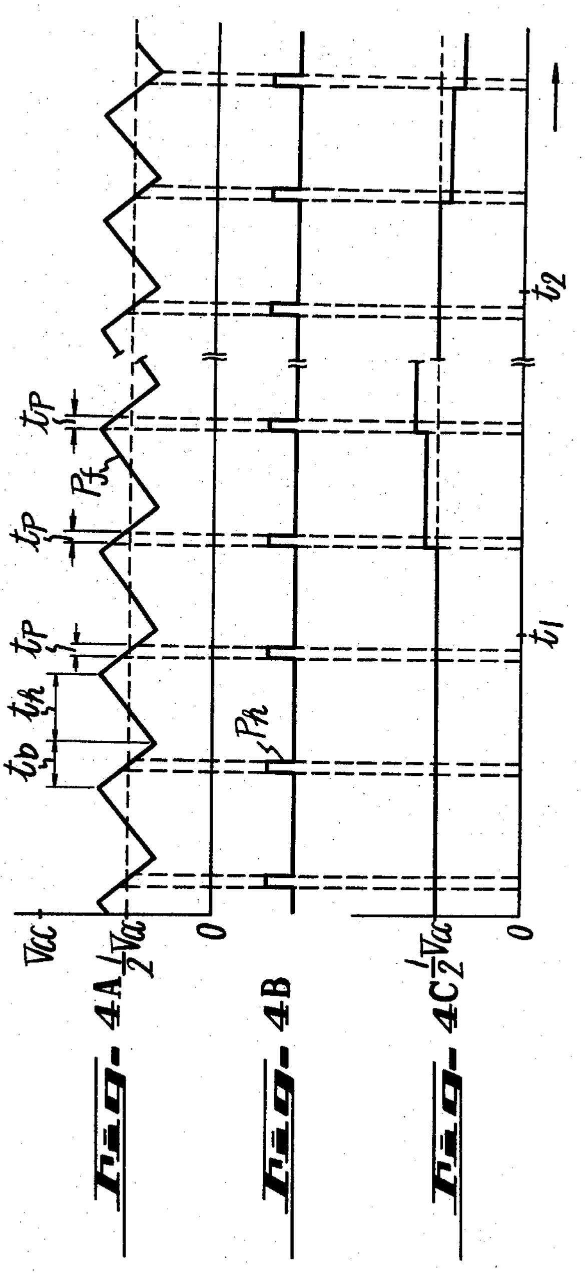
FIGS. 4A, 4B and 4C are waveform diagrams for explaining the operation of the phase comparing circuit exemplified in FIG. 3.

The base of transistor 23 is connected to an input terminal 11, through which the horizontal synchronous pulse Ph, such as is depicted in FIG. 4B, is applied to transistor 23 to turn it "on" only in the period $t_p$ of the horizontal synchronous pulse. In FIG. 4, reference characters $t_h$ and $t_b$ respectively designate a horizontal scanning period and a horizontal blanking period. Finally, the connection point between diodes 20 and 21 is connected to an output terminal 13, which is grounded through a capacitor 41 and also connected to a horizontal oscillator circuit 42.

The described phase comparing circuit according to this invention operates as follows.

In the event that the horizontal synchronous pulse Ph and the sawtooth wave voltage signal Pf are in phase with each other, that is, when the center of the negative inclined portion (the flyback portion) of the sawtooth wave voltage signal Pf lies at the position of the horizontal synchronous pulse Ph (before a time $t_1$ in FIG. 4), no synchronous pulse Ph is produced in the horizontal scanning period $t_h$, so that the transistors 16 and 23 are respectively turned to their "on" and "off" states. Therefore, if the impedance of the constant-current power source is small, the potential at the point *b* (where diodes 18 and 20 are connected to the collector of transistor 16) is nearly equal to the ground potential, and the potential at the point *c* (where diodes 19 and 21 are connected to the collector of transistor 23) is substantially equal to the power source potential Vcc. At the same time, the potential at the point *a* is equal to the value of the sawtooth wave voltage Pf, which is a voltage between the power source potential Vcc and the ground potential. Accordingly, the diodes 18,19,20 and 21 are reverse biased and hence turned "off".

In the horizontal synchronous pulse period $t_p$, the horizontal synchronous pulse Ph is applied to the base of transistor 23 to turn it "on" and to turn "off" the transistor 16. When the signals Ph and Pf are in phase with each other, the potential at the connection point *a* is equal to that at the center of the negative inclined portion of the sawtooth wave voltage signal Pf, that is the voltage one-half Vcc, in the horizontal synchronous pulse period $t_p$, so that the diodes 18 and 19 are biased in forward direction to be turned "on" and the potentials at the connection points *b* and *c* become approximately one-half Vcc. Strictly speaking, the potentials at *b* and *c* are different from one-half Vcc by the forward drop voltage of diodes 18 and 19. The diodes 20 and 21 are also biased in forward direction to be turned "on" by the nonconduction of the transistor 16 and the conduction of the transistor 23 and since the potentials at the connection points *b* and *c* are 1/2 Vcc, the output terminal 13 has a potential one-half Vcc, as depicted in FIG. 4C. This potential is held unchanged by the capacitor 41, even if the diodes 18,19,20 and 21 are switched "off" in the horizontal scanning period $t_h$. Therefore, the potential at the connection point between the diodes 20 and 21 is maintained at one-half Vcc.

However, when the horizontal oscillation frequency is decreased, for example, after time $t_1$, and the frequency of the flyback pulse is correspondingly decreased to delay the phase of the sawtooth wave voltage signal the transistors 16 and 23 are respectively changed to their "off" and "on" states at the potential higher than that of the center of the negative inclined portion of the sawtooth wave voltage signal, that is, at a potential higher than one-half Vcc. Therefore, in the horizontal synchronous pulse period $t_p$, the potential at the connection point *a* becomes higher than one-half Vcc. In this case, the potential at the output terminal 13 is held at about one-half Vcc by the capacitor 41 and the diode 20 is in its "on" state, so that the potential at the connection point *b* is about one-half Vcc. Accordingly, the bias of the diode 18 is lower than a conduction bias value, that is, lower than a forward drop voltage or a reverse bias value, and the diode 18 is turned "off". At the same time, the potential at the connection point *a* is higher than one-half Vcc and the transistor 23 is in its "on" state, so that the diode 19 is switched "on" to raise the potential at the connection point *c* higher than one-half Vcc. Further, since the potential at the output terminal 13 is one-half Vcc, the bias of the diode 20 becomes lower than the conduction bias value to turn "off" the diode 21. As a result of this, the capacitor 41 is charged by the power source potential Vcc through the resistor 17 and the diode 20, and the potential at the output terminal 13 exceeds one-half Vcc.

When the potential at the output terminal 13 has reached that of the connection point *c* in excess of one-half Vcc, the diode 21 is turned "on" and the diode 18 is also switched "on", and thus all the diodes 18,19, 20 and 21 are turned "on". Consequently, a voltage corresponding to the phase difference between the two signals Ph and Pf to be compared in phase is obtained at the output terminal 13 and the capacitor 41 is charged up to this voltage. This operation is achieved transiently.

The voltage thus stored in the capacitor 41 is held from the moment of the conduction of the diodes 18,19, 20 and 21 through the horizontal scanning period $t_h$, so that, when a phase difference exists between the pulses Ph and Pf, the capacitor 41 is charged to substantially the peak value until the arrival of the next pulse Ph.

When the horizontal oscillation frequency is increased, for example, after the time $t_2$ and the flyback pulse is correspondingly advanced in phase, the transistors 16 and 23 are respectively turned to their "off" and "on" states at the potential lower than that of the center of the negative inclined portion of the sawtooth wave voltage signal Pf. Therefore, the diodes 18 and 21 are turned "on" and the diodes 19 and 20 are switched "off" and the potential at the output terminal 13 is discharged down to that at the connection point *a* through the diode 21 and becomes lower than one-half Vcc. When the potential at output terminal 13 has become equal to that at connection point *a*, the diodes 18,19,20 and 21 are all switched "on".

Accordingly, when the output or phase compared voltage supplied to oscillator 42 is equal to one-half Vcc, the horizontal oscillator 42 oscillates at a predetermined horizontal oscillation frequency. When the output or phase compared voltage is higher than one-half Vcc, the oscillation frequency of the horizontal oscillator 42 is increased, and when the phase compared voltage is lower than one-half Vcc, the oscillation frequency is decreased. Thus, the horizontal oscillation frequency can be held at a predetermined value at all times.

Circuits according to the present invention do not require any capacitor for phase comparison in principle and, even in the case where the compared output is to be maintained as in FIG. 3, only one capacitor 41 is required and is connected to the output terminal 13 which is inevitably provided, so that there is no hindrance to making the phase comparing circuit in the form of an integrated circuit. Further, in such a case, the number of terminals for external connection can be minimized, for example, reduced to a total of five terminals including input terminals 11 and 12, output terminal 13, power source terminal 15 and ground terminal 14.

As will be seen from the foregoing, in the case of an automatic frequency control circuit employing the phase comparing circuit according to this invention, the charging time constant of the capacitor 41 is small and the capacitor 41 holds the peak value of the charging voltage, so that a relatively great phase compared output is obtained at terminal 13 to provide for enhanced control sensitivity of the automatic frequency control circuit.

Further, in an automatic frequency control circuit using the phase comparing circuit of this invention the noise-proof characteristic of the phase compared output obtained at terminal 13 with respect to any noise mixed with the horizontal synchronous pulse Ph is raised. Thus, even if a noise signal is mixed in the horizontal synchronous pulse Ph supplied to input terminal 11 in the horizontal scanning period $t_h$, no noise component appears in the output at terminal 13 because the diode 20 is in the "off" state with respect to any noise which does not exceed the synchronous signal level. Even in the case of noises at levels higher than the synchronous signal level, if they are random noises, compared outputs due to them are averaged and no change is caused in the DC output voltage.

Even if the horizontal synchronous pulse Ph is not supplied to input terminal 11, the potential at output terminal 13 becomes one-half Vcc and the horizontal oscillation frequency becomes a predetermined value. Thus, in the absence of the horizontal synchronous pulse Ph, no change is caused in the horizontal oscillation frequency and stable horizontal scanning can be achieved.

In the foregoing, when the horizontal synchronous pulse Ph and the flyback pulse Pf are in-phase with each other, the voltage one-half Vcc is derived from the output terminal 13, but it will be seen that the voltage need not always be one-half Vcc.

Referring now to FIG. 5, another example of a phase comparing circuit according to this invention will be described as being applied to a color signal demodulating circuit of color television receivers.

In the circuit of FIG. 5, a transistor 64 serving as a constant-current power source is connected in series to an emitter circuit of a differential amplifier 67R made up of a pair of transistors 51R and 58R and the collectors of the transistor 51R and 58R are connected to a DC power source terminal 68 through resistors 52 and 57, respectively.

More specifically, as shown, the emitters of the transistors 51R and 58R are interconnected and further connected to a ground terminal 66 through the collector and emitter of transistor 64. Further, a series circuit consisting of resistors 62A,62B and 62C is connected between the power source terminal 68 and the ground terminal 66. The connection point between the resistors 62A and 62B is connected to the base of transistor 51R and the connection point between the resistors 62B and 62C is connected to the base of transistor 64.

A pair of diodes 53R and 54R connected in series to each other in the same direction and another pair of diodes 55R and 56R connected in series to each other in the same direction as the diodes 53R and 54R are connected between the collectors of transistors 51R and 58R. A modulated color signal, for example, a chrominance signal $S_C$, which is produced by amplitude-modulating color subcarrier signals of different phases but of the same frequency (for example, 3.58 MHz) with different color difference signals and by adding them together, is supplied through an input terminal 63 to the connection point *a* between the diodes 53R and 54R. A reference subcarrier signal $S_R$ (a reference signal) of 3.58 MHz, which has the same phase as that of any one of color signal components of the chrominance signal, for example, a red color difference signal, is supplied to the base of transistor 58R through an input terminal 59R. The connection point *d* between the diodes 55R and 56R is connected to an output terminal 60R, which is grounded through a capacitor 61R. The resistance values of the resistors 52 and 57 are selected so as to be equal to each other.

The above described phase comparing circuit of FIG. 5 operates as follows.

Assuming that transistors 58R and 51R are adapted to be in the "off" state and in the "on" state, respectively, in the negative half cycle of the reference signal $S_R$, then the potential at the connection point *b* becomes nearly equal to the ground potential and that at the connection point *c* becomes substantially equal to the power source potential Vcc applied to terminal 68. In the positive half cycle of the reference signal $S_R$, the transistor 58R is turned "on" and the transistor 51R is turned "off", so that the potential at connection point *c* becomes equal to the power source potential Vcc and that at the connection point *c* becomes nearly equal to the ground potential, thus causing all the diodes 53R,54R,55R and 56R to be turned "on" or in their conducting state. Since the connection points *b* and *c* have been short-circuited, the connection point *a* and the connection point *d*, that is, the output terminal 60, are connected to each other, thereby providing a color signal, for example, a red color difference signal R-Y, which is produced by demodulating the signal $S_C$ applied to the input terminal 63 at that time. In this case, the output impedances of the transistors 51R and 58R are very high, so that even if a signal source of a high output impedance is used as the source of the chrominance signal $S_C$, the signal $S_C$ is not attenuated by the output impedances of the signal source and of the transistors 51R and 58R, and the color difference signal can be obtained.

Further, in the illustrated example two more differential amplifiers 67G and 67B are provided. The input terminal 59G of differential amplifier 67G is supplied with a reference subcarrier signal $S_G$ (a reference signal) of 3.58 MHz having the same phase as that of a green color difference signal and the input terminal 59B of differential amplifier 67B is supplied with a reference subcarrier signal $S_B$ of 3.58 MHz having the same phase as that of a blue color difference signal. The differential amplifiers 67G and 67B are identical in construction with the previously described differential amplifier 67R, and hence are not specifically described nor illustrated in detail on the drawing.

The circuit according to this invention as described above does not require the capacitors used in conventional color demodulator circuits and thus enables such a circuit to be provided in the form of an integrated circuit. The capacitors 61R,61G and 61B can be simply connected to the output terminals 60R,60G and 60B, but no leads are required for connections to other points in the differential amplifiers 67R, 67G and 67B, so that connecting the capacitors is facilitated.

Further, the states of the transistors 51R,51G,51B and the transistors 58R,58G,58B are inverted by the reference signals $S_R$,$S_G$ and $S_B$, and the signals $S_R$,$S_G$ and$S_B$ are balanced in the differential amplifiers 67R, 67G and 67B, so that they do not appear at the output terminals 60R, 60G and 60B. Further, by reason of the foregoing, a filter connected to a stage following each differential amplifier may be simple one having a capacitor or the like. More specifically, only the signal fed to the terminal 63 is derived during the connection of the transistors 58R, 58G and 58B and such signal is obtained without any distortion.

Even if the signal levels are made to drift by temperature changes or the like, the fact that the amplifiers 67R, 67G and 67B are formed on the same semiconductor substrate ensures that the amounts of drift in the amplifiers are equal to one another. Therefore, the use of the circuit according to this invention eliminates the possibility of losing the proper white balance in the reception of color video signals, and hence provides for enhanced picture quality especially when reproducing a monochrome picture.

Although the carrier color signal is applied as a color signal to the terminal in the foregoing, it is also possible to apply to terminal 63 a signal including such a carrier color signal and a luminance signal. In such a case, demodulated red, green and blue color signals can be derived from from the output terminal 61R, 61G and 61B, respectively.

As has been described in the foregoing, the present invention makes possible the provision of phase comparing circuits without capacitor elements therein and which include only transistors of the same conductivity type, whereby to facilitate the making of the circuit in the form of an integrated circuit. Although phase comparing circuits according to this invention have been described as being applied to the automatic frequency control circuit and the color signal demodulating circuit of television receivers, it is apparent that phase comparing circuits according to this invention are applicable to other circuits and devices.

Further, although specific embodiments of the invention have been described in detail with reference to the accompanying drawings, it is to be understood that the invention is not limited to those precise embodiments, and that various changes and modifications may be effected therein by one skilled in the art without departing from the scope or spirit of the invention.

What Is Claimed Is:

1. A semiconductor circuit for phase comparison comprising a pair of transistors of the same conductivity type and each having first, second and third electrodes with said third electrodes being coupled to each other, means for producing a constant current and being connected to said coupled third electrodes, first and second circuit means each including a plurality of series connected diodes, said first and second circuit means being connected between said second electrodes of the pair of transistors, said series connected diodes in each of said circuit means having the same direction of conductive polarity, means for supplying a first input signal to said first electrode of one of said transistors, means for supplying a second input signal to a connection point between the series connected diodes in said first circuit means, and means for picking up an output signal from a connection point between the series connected diodes in said second circuit means.

2. A semiconductor circuit for phase comparison in accordance with claim 1, wherein said first, second and third electrodes are respectively the base, collector and emitter of the respective transistor.

3. A semiconductor circuit for phase comparison in accordance with claim 1, wherein the first electrode of the other of said transistors is provided with a fixed bias voltage.

4. A semiconductor circuit for phase comparison in accordance with claim 1, wherein said first and second circuit means each consist of two of said diodes connected in series, and, said first and second circuit means are in parallel and have their respective diodes conductive in the same direction between said second electrodes of the pair of transistors.

5. A semiconductor circuit for phase comparison in accordance with claim 4, wherein the cathode of one of said series connected diodes in each of said first and second circuit means is connected to the second electrode of said one transistor which is supplied with the first input signal at said first electrode thereof and the anode of the other of said series connected diodes in each of said first and second circuit means is connected to the second electrode of the other of said transistors.

6. A semiconductor circuit for phase comparison in accordance with claim 1, wherein said second electrodes of the transistors are each connected to a power source through a respective resistor.

7. A semiconductor circuit for phase comparison in accordance with claim 1, wherein said constant current producing means includes a transistor supplied with a fixed bias voltage.

8. A semiconductor circuit for phase comparison in accordance with claim 7, wherein said transistor included in the constant current producing means is of the same conductivity type as the first mentioned pair of transistors.

9. A phase comparing circuit in a television receiver having horizontal oscillator means, said phase comparing circuit comprising a pair of transistors of the same conductivity type and each having first, second and third electrodes with said third electrodes being coupled to each other, means for producing a constant current and being connected to said coupled third electrodes, first and second circuit means each including a plurality of diodes connected in series between said second electrodes of the pair of transistors; means for supplying a horizontal synchronous signal to said first electrode of one of said transistors, means for supplying a signal made from an output of said horizontal oscillator means to a connection point between said diodes in said first circuit means, and means for detecting an output at a connection point between said diodes in said second circuit means and for supplying said output to said horizontal oscillator means so as to control the latter.

10. A phase detecting circuit used for demodulating color signals in a color television receiver, comprising three circuit components, each circuit component including a pair of transistors of the same conductivity type and each having first, second and third electrodes with said third electrodes being coupled to each other, means for producing a constant current and being connected to said coupled third electrodes, first and second circuit means each including a plurality of diodes connected in series between said second electrodes of said transistors, means for supplying a respective reference subcarrier signal to said first electrode of one of said transistors in each of said components, means for supplying a modulated color signal to a connecting point between said series connected diodes in said first circuit means of each of said components, and means for deriving a corresponding demodulated color signal from a connection point between the series connected diodes in said second circuit means of each of said components.

11. A phase detecting circuit used for demodulating color signals in a color television receiver in accordance with claim 10, wherein said connection points between the series connected diodes in the first circuit means of said three circuit components are connected in common.

* * * * *